(12) United States Patent
Riegler (10) Patent No.: US 9,741,835 B2
(45) Date of Patent: Aug. 22, 2017

(54) SEMICONDUCTOR DEVICE AND INSULATED GATE BIPOLAR TRANSISTOR WITH TRANSISTOR CELLS AND SENSOR CELL

(71) Applicant: Infineon Technologies AG, Neubiberg (DE)

(72) Inventor: Andreas Riegler, Lichtpold (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/942,623

(22) Filed: Nov. 16, 2015

(65) Prior Publication Data

US 2016/0141403 A1 May 19, 2016

(30) Foreign Application Priority Data

Nov. 17, 2014 (DE) .................. 10 2014 116 773

(51) Int. Cl.
| | |
|---|---|
| *H01L 21/00* | (2006.01) |
| *H01L 29/739* | (2006.01) |
| *H01L 29/10* | (2006.01) |
| *H01L 29/423* | (2006.01) |
| *H01L 29/06* | (2006.01) |

(52) U.S. Cl.
CPC ...... *H01L 29/7397* (2013.01); *H01L 29/0696* (2013.01); *H01L 29/1095* (2013.01); *H01L 29/4238* (2013.01); *H01L 29/0619* (2013.01)

(58) Field of Classification Search
CPC ............ H01L 29/7397; H01L 29/0696; H01L 29/4238
See application file for complete search history.

(56) References Cited

U.S. PATENT DOCUMENTS

| | | | |
|---|---|---|---|
| 5,365,085 A | 11/1994 | Tokura et al. | |
| 5,654,560 A | 8/1997 | Nishizawa et al. | |
| 2009/0114947 A1 | 5/2009 | Fukuda et al. | |
| 2009/0189219 A1 | 7/2009 | Shinbori et al. | |
| 2011/0198587 A1 | 8/2011 | Takeuchi | |
| 2015/0029627 A1* | 1/2015 | Mauder | H01L 29/7397 361/87 |
| 2015/0333168 A1* | 11/2015 | Hirler | H01L 29/0615 257/329 |

FOREIGN PATENT DOCUMENTS

DE    102008056388 A1    5/2009

* cited by examiner

*Primary Examiner* — Laura Menz
(74) *Attorney, Agent, or Firm* — Murphy, Bilak & Homiller, PLLC (57) ABSTRACT

A transistor cell region of a semiconductor device includes transistor cells that are electrically connected to a first load electrode. An idle region includes a gate wiring structure that is electrically connected to gate electrodes of the transistor cells. A transition region, which is disposed between the transistor cell region and the idle region, includes at least one sensor cell that is electrically connected to a sense electrode. The at least one sensor cell is configured to convey a unipolar current during an on state of the transistor cells.

20 Claims, 6 Drawing Sheets

SEMICONDUCTOR DEVICE AND INSULATED GATE BIPOLAR TRANSISTOR WITH TRANSISTOR CELLS AND SENSOR CELL

PRIORITY CLAIM

This application claims priority to German Patent Application No. 10 2014 116 773.2 filed on 17 Nov. 2014, the content of said application incorporated herein by reference in its entirety.

BACKGROUND

Semiconductor switching devices for power applications include transistor cells arrays with a plurality of transistor cells electrically arranged in parallel. The transistor cells control a load current in a load path of the power application. Sense transistor cells integrated in the cell array sense a current through a sense path. The transistor and sense cells may be commonly controlled. On the basis of voltage differences in the sense and load paths, an overcurrent detection circuit may estimate the current flowing through the transistor cells and may turn off the semiconductor switching device when the estimated load current exceeds a predefined threshold.

It is desirable to precisely detect a load current at low complexity and low loss of device performance.

SUMMARY

According to an embodiment, a semiconductor device includes a transistor cell region with transistor cells, wherein the transistor cells are electrically connected to a first load electrode. An idle region includes a gate wiring structure electrically connected to gate electrodes of the transistor cells. A transition region disposed between the transistor cell region and the idle region includes a sensor cell electrically connected to a sense electrode. The sensor cell conveys a unipolar current during an on-state of the transistor cells.

According to an embodiment, an insulated gate bipolar transistor includes a transistor cell region with transistor cells, wherein the transistor cells are electrically connected to a first load electrode. An idle region includes a gate wiring structure electrically connected to gate electrodes of the transistor cells. A transition region disposed between the transistor cell region and the idle region includes a sensor cell electrically connected to a sense electrode. The sensor cell conveys a unipolar current during an on-state of the transistor cells.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference sign in the different drawings, respectively, if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors or elements that are controllable to temporarily provide a low-ohmic connection in a first state and a high-ohmic electric decoupling in a second state.

FIGS. 1A to 1D refer to a semiconductor device 500 including a bipolar device, e.g., an IGBT (insulated gate bipolar transistor), for example, a PT-IGBT (punch through IGBT), an NPT-IGBT (non-punch through IGBT), an RC-IGBT (reverse conducting IGBT) or a semiconductor device integrating an IGBT and one or more further logic or analogue circuits, e.g., a gate driver circuit and/or an over-current protection circuit.

Figure 1A:
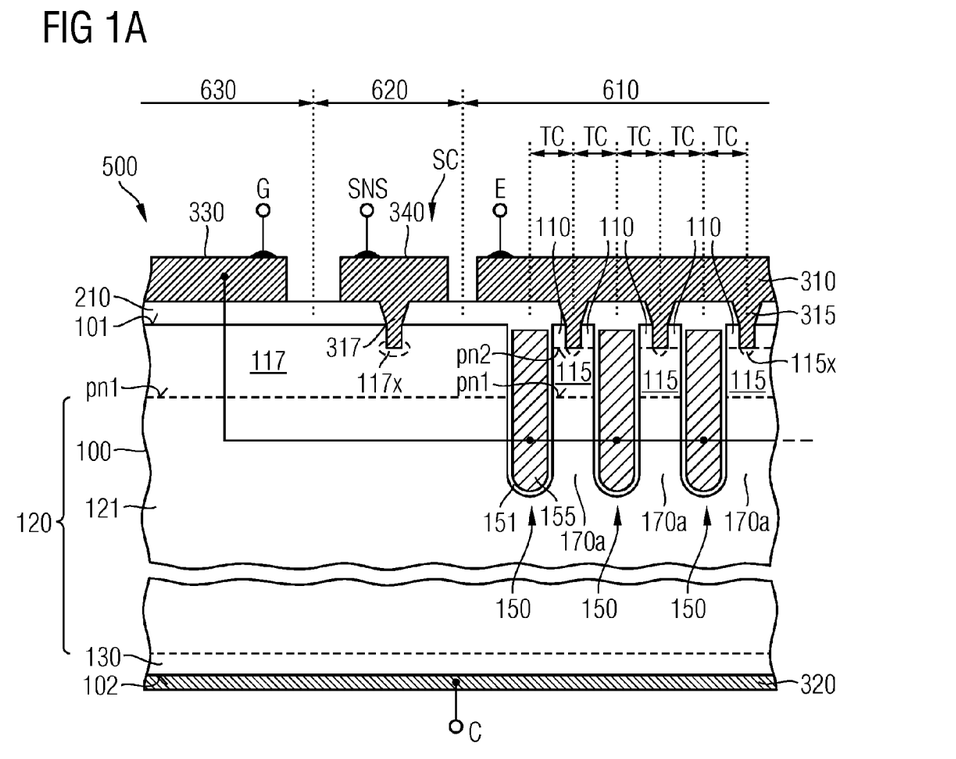
FIG. 1A is a schematic vertical cross-sectional view of a portion of a semiconductor device according to embodiments concerning sense cells, wherein the cross-section cuts through a sense cell.

The semiconductor device 500 is based on a semiconductor body 100 of a crystalline semiconductor material, for example silicon (Si), silicon carbide (SiC), germanium (Ge), silicon germanium (SiGe), gallium nitride (GaN), gallium arsenide (GaAs) or any other $A_{III}B_V$ semiconductor. At a front side the semiconductor body 100 has a first surface 101 which is planar or which is spanned by coplanar surface sections. A minimum distance between the first surface 101 and a planar second surface 102 at an opposite rear side and parallel to the first surface 101 defines the voltage blocking capability of the semiconductor device 500. For example, the semiconductor body 100 of an IGBT specified for a blocking voltage of about 1200 V may have a thickness between 90 µm and 110 µm. Embodiments related to higher blocking capabilities may be based on semiconductor bodies 100 with a thickness of several 100 µm.

In a plane perpendicular to the cross-sectional plane, the semiconductor body 100 may have an approximately rectangular shape with an edge length in the range of several millimeters. A normal to the first surface 101 defines a vertical direction and directions orthogonal to the vertical direction are horizontal directions.

The semiconductor body 100 includes a drift structure 120 of a first conductivity type, wherein a main portion of the drift structure 120 forms a drift zone 121. In the drift zone 121, a dopant concentration may gradually or in steps increase or decrease with increasing distance to the first surface 101 at least in portions of its vertical extension. According to other embodiments, the dopant concentration may be approximately uniform in the complete drift zone 121. A mean dopant concentration in the drift zone 121 may be between $1E12$ $cm^{-3}$ and $1E15$ $cm^{-3}$, for example in a range from $5E12$ $cm^{-3}$ to $5E13$ $cm^{-3}$.

The semiconductor body 100 further includes a collector structure 130 between the drift structure 120 and the second surface 102. The collector structure 130 may be a contiguous layer of the second conductivity type, which is the opposite of the first conductivity type. According to embodiments related to RC-IGBTs, the collector structure 130 may include zones of both conductivity types. The dopant concentration in the collector structure 130 is sufficiently high to ensure a low ohmic contact to a metal structure adjoining the second surface 102. For example, a maximum dopant concentration in the collector structure 130 along the second surface 102 may be at least $1E18$ $cm^{-3}$, for example at least $5E19$ $cm^{-3}$.

A transistor cell region 610 of the semiconductor body 100 includes transistor cells TC, e.g., IGFET (insulated gate field effect transistor) cells. The transistor cells TC may be vertical transistor cells including planar gate structures formed outside the semiconductor body 100 along the first surface 101.

The semiconductor device 500 of FIG. 1A is based on vertical transistor cells TC with trench gate structures 150 extending from the first surface 101 into the semiconductor body 100.

The gate structures 150 include a conductive gate electrode 155 and a gate dielectric 151 separating the gate electrode 155 from the semiconductor body 100. The gate electrode 155 may be a homogeneous structure or may have a layered structure including one or more metal containing layers. According to an embodiment, the gate electrode 155 may include or consist of a heavily doped polycrystalline silicon layer.

The gate dielectric 151 may have uniform thickness and may include or consist of a semiconductor oxide, for example thermally grown or deposited silicon oxide, a semiconductor nitride, for example deposited or thermally grown silicon nitride, or a semiconductor oxynitride, for example silicon oxynitride.

Semiconducting portions of the transistor cells TC are formed in active cell mesas 170a adjoining at least one gate structure 150. The active mesas 170a include source zones 110 of the first conductivity type and body zones 115 of the second conductivity type, wherein the body zones 115 separate the source zones 110 from the drift structure 120 and form first pn junctions pn1 with the drift structure 120 and second pn junctions pn2 with the source zones 110.

A layer structure including an interlayer dielectric 210 separates electrode structures 310, 330, 340 from the semiconductor body 100. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example. The layer structure may include further layers, e.g., portions of a gate electrode.

In the transistor cell region 610 contact structures 315 extending through the interlayer dielectric 210 electrically connect a first load electrode 310 with the source zones 110 and the body zones 115 of the transistor cells TC, wherein heavily doped body contact zones 115x may form low-ohmic contacts between the body zones 115 and the contact structures 315. The first load electrode 310 may form or may be electrically coupled or connected to an emitter terminal E. A second load electrode 310 directly adjoining the second surface 102 and the collector layer 130 may form or may be electrically coupled or connected to a collector terminal C.

In an idle region 630 of the semiconductor device 500, a gate wiring structure 330 electrically connected to the gate electrodes 155 of the transistor cells TC is arranged at the front side and outside of the semiconductor body 100. A layer structure including at least the interlayer dielectric 210 may separate the gate wiring structure 330 from the semiconductor body 100. The gate wiring structure 330 may form or may be electrically coupled or connected to a gate terminal G or to an output of an internal gate driver circuit integrated in the semiconductor device 500.

The gate wiring structure 330 may include at least one of a gate pad, a gate finger and a gate runner, wherein a gate pad is a metal pad suitable as a landing pad for a bondwire or another chip-to-lead frame or a chip-to-chip connection like a soldered clip. A gate runner is a conductive line running along at least one edge of the transistor cell region 610, wherein the conductive line may be a metal line or a connection line consisting of or including a heavily doped semiconductor material. A gate finger is a conductive line dividing a transistor cell region 610 into separate transistor cell fields, wherein the conductive line may be a metal line or a connection line consisting of or including a heavily doped semiconductor material.

Figure 1B:
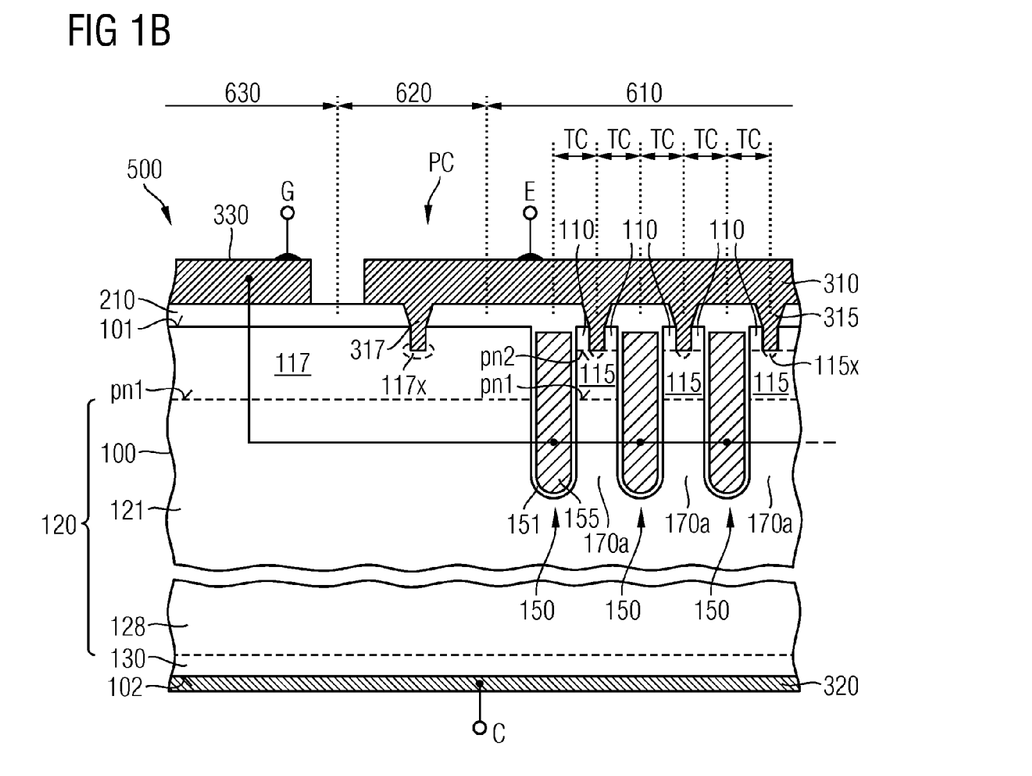
FIG. 1B is a schematic vertical cross-sectional view of the semiconductor device portion of FIG. 1A parallel to the cross-section of FIG. 1A, wherein the cross-section cuts through a purge cell.

A transition region 620 sandwiched between the idle region 630 and the transistor cell region 610 includes at least one sense cell SC as illustrated in FIG. 1A. According to an embodiment, the transition region 620 exclusively includes sense cells SC. According to other embodiments, the transition region 620 may include purge cells PC as illustrated in FIG. 1B in addition to one or more sense cells SC.

The sense cell SC includes a purge zone 117 of the conductivity type of the body zones 115. The purge zone 117 is formed at least along one edge of the transistor cell region 610 and may directly adjoin a gate structure 150 of the outermost transistor cell TC of the transistor cell region 610. A vertical extension of the purge zone 117 in the transition region 620 may correspond to the vertical extension of the body zones 115 in the active cell mesas 170a or to a vertical extension of other doped zones of the same conductivity type that extend from the first surface 101 into the semiconductor body 100.

Further contact structures 317 extending through the interlayer dielectric 210 electrically connect a sense electrode 340 with the purge zones 117 of the sense cells SC in the transition region 620, wherein heavily doped purge contact zones 117x may form a low-ohmic contact between the purge zones 117 and the further contact structures 317. The sense electrode 340 may form or may be electrically coupled or connected with a sense terminal SNS, with an internal sense load and/or with an internal sense circuit integrated in the semiconductor device 500.

According to an embodiment, an external sense load or shunt is electrically connected to the sense terminal SNS and an external sense circuit senses the voltage drop across the external sense load. The external sense circuit may output a signal indicating an overcurrent or overload condition of the semiconductor device 500 or may directly shutdown a signal applied to the gate terminal G.

The purge cells PC differ from the sense cells SC in that the purge zones 117 of the purge cells PC are not directly electrically connected to the sense electrode 340 but to first load electrode 310.

The following description of the effects of the purge and sense cells PC, SC refers to n-channel IGBTs with p-type body zones 115. Similar considerations as outlined below apply to embodiments with the body zones 115 being p-type.

When a voltage applied to the gate wiring structure 330 exceeds a preset threshold voltage, electrons in the body zones 115 accumulate in channel portions directly adjoining the gate dielectrics 151. The accumulated electrons form inversion channels between the source zones 110 and the drift structure 120. Electrons passing through the inversion channels into the drift structure 120 are effective as a base current for a bipolar transistor structure formed by the p-type body zones 115, the n-type drift structure 120 and the p-type collector layer 130 such that a bipolar current involving both types of carriers, i.e., electrons and holes, flows between the first load electrode 310 and the second load electrode 320 and turns on the semiconductor device 500. Charge carriers of both types flood the drift structure and a charge carrier plasma with high carrier density builds up in the semiconductor body 100.

During the on-state, the purge cells PC drain off holes from the semiconductor body 100. In this way, the purge cells PC keep the hole density low in the idle and transition regions 630, 620 while contributing to the total on-state current.

When the semiconductor device turns off, the charge carrier plasma is removed by draining the charge carriers off through the load electrodes 310, 320. The less charge carriers have to be removed during the off-state, the lower are the switching losses of the semiconductor device 500.

Since yet during the on-state the purge cells PC drain off such holes that otherwise may flood the idle region 630 in the on-state of the IGBT 501 without contributing to a low on-state resistance RDSon, only few charge carriers have to be removed from the idle region 630. In this way the purge cells PC significantly reduce switching losses of the semiconductor device 500.

A sense cell SC which is arranged in the transition region 620 and which differs from the purge cells PC only in that the sense cell SC is electrically connected to a sense electrode 340 where the purge cells PC are electrically connected to the first load electrode 310 may be used for sensing a hole current proportional to the load current without losing useful area for active transistor cells TC. The sense cells SC further contribute in keeping the charge carrier plasma low in the idle regions 630. Formation of the sense cells requires only few and low-critical modifications in existing process flows.

Figure 1C:
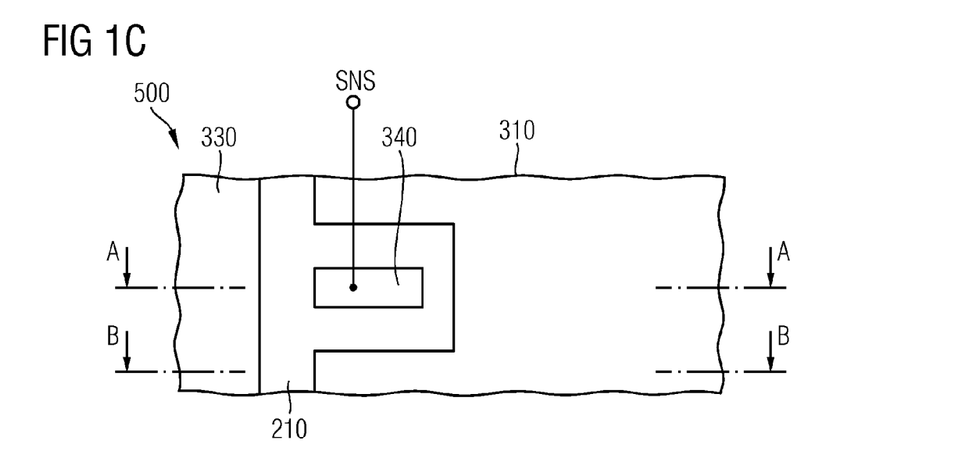
FIG. 1C is a schematic plan view of the semiconductor device portion of FIGS. 1A, 1C.

As illustrated in FIG. 1C an edge of a first load electrode 310 oriented to the gate wiring structure 330 may have one or more notches in which one or more sense electrodes 340 may be formed. The sense electrode 340 may form a sense terminal SNS of the semiconductor device 500 or may be electrically coupled or connected to a sense terminal SNS or an input of an integrated sense circuit. For example, a bondwire may electrically connect the sense electrode 340 with the sense terminal. According to another embodiment a conductor line in the plane of the electrodes 310, 330, 340 or in another wiring layer may electrically connect the sense electrode 340 with the sense terminal SNS or with an integrated sense circuit.

Figure 1D:
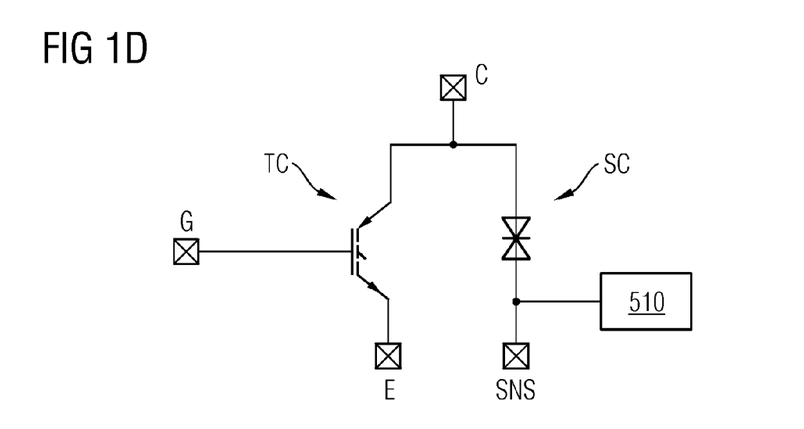
FIG. 1D is a schematic circuit diagram of a power portion of the semiconductor device of FIGS. 1A, 1C and 1D

FIG. 1D shows a sense cell SC electrically connected between a collector terminal C and a sense terminal SNS and/or an integrated sense circuit 510 that may include a defined sense resistor for sensing a charge carrier flow through the sense cell SC. The integrated sense circuit may output a control signal that controls a gate driver electrically connected to the gate wiring structure 330. If the integrated sense circuit indicates that the sense current exceeds a predetermined threshold, the control signal may turn off the gate driver.

Figure 2A:
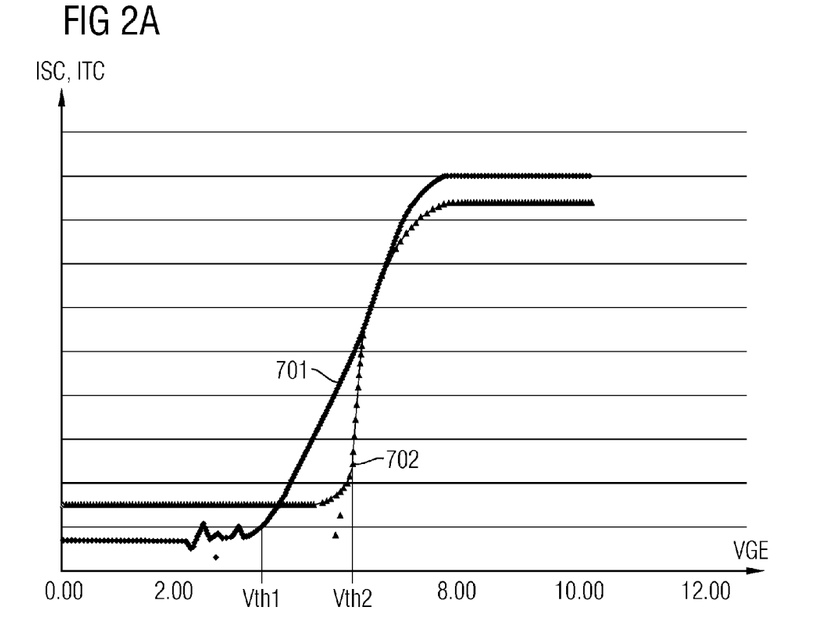
FIG. 2A is a schematic diagram showing a correlation between a unipolar current through a sense cell and a bipolar load current through transistor cells for illustrating effects of the embodiments.

In FIG. 2A, line 701 plots a load current ITC through the transistor cells TC of an n-channel IGBT as a function of a gate-to-emitter voltage VGE. Line 702 plots a corresponding unipolar charge carrier flow ISC through sense cells SC as a function of the gate voltage VGE, respectively.

The transistor cells TC turn on, when the gate voltage VGE exceeds at a first threshold voltage Vth1 at which the inversion channels through the body zones of the transistor cells TC are formed. A unipolar electron current flows into the semiconductor body 100 and at first no holes are detectable through the sense cells SC which can only convey a hole current. When the gate voltage VGE exceeds the second threshold voltage Vth2, hole injection starts and the sense cells SC start detecting a hole current. Since in the resulting charge carrier plasma, the number of electrons corresponds to the number of holes, the load current ITC through the transistor cells TC can be estimated on the basis of the detected hole current ISC through the sense cells SC.

Figure 2B:
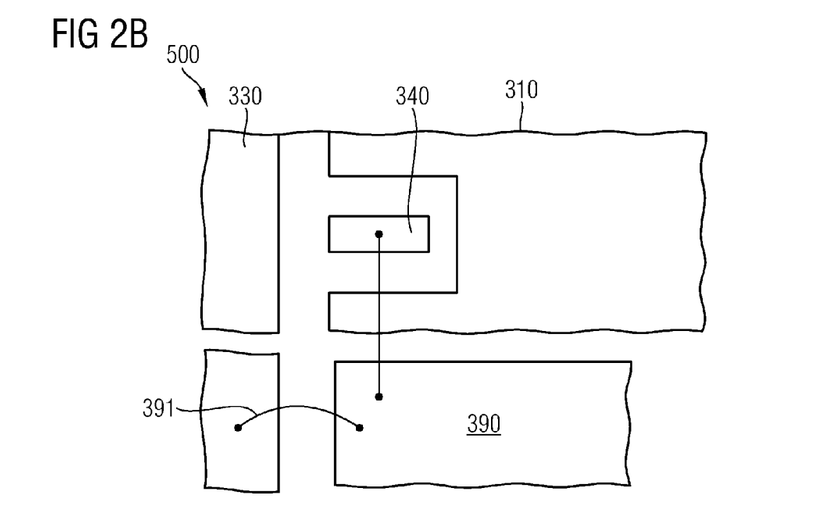
FIG. 2B is a schematic plan view of a semiconductor device according to an embodiment concerning a bondwire connecting a sense cell with a load electrode.

In FIG. 2B a conductor line in the plane of the electrodes 310, 330, 340 or in another wiring layer may electrically connect the sense electrode 340 with a sense pad 390 and a bondwire 391 electrically connects the sense pad 390 with the first load electrode 310. Semiconductor devices with and without sense cells can be manufactured using the same processes up to wiring bonding.

Figure 3A:
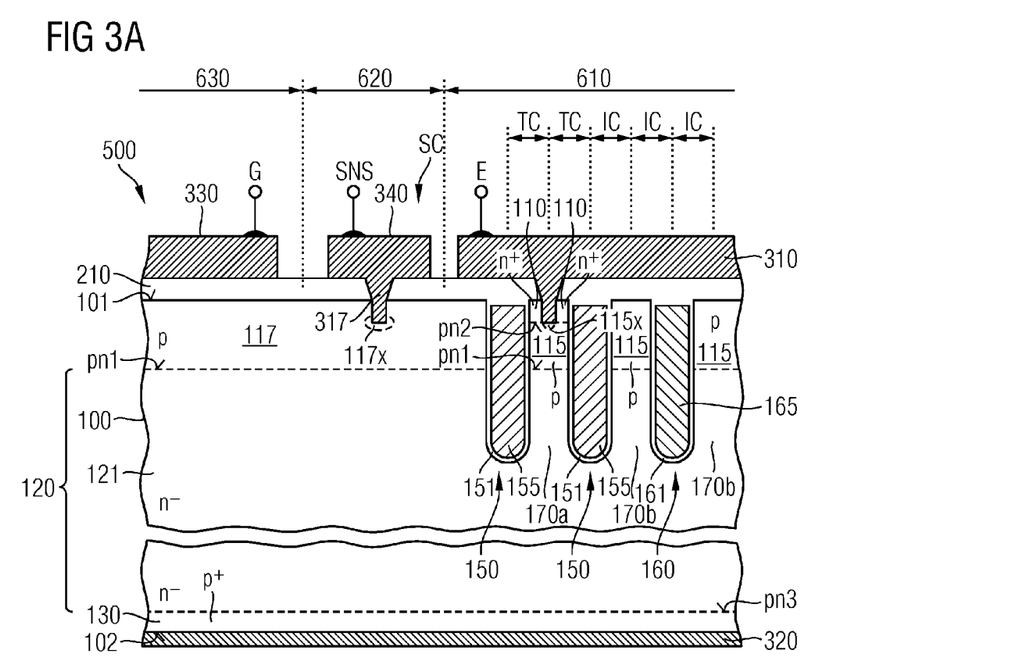
FIG. 3A is a schematic vertical cross-sectional view of a portion of a semiconductor device according to an embodiment concerning transistor cells with stripe-shaped cell mesas.
Figure 3B:
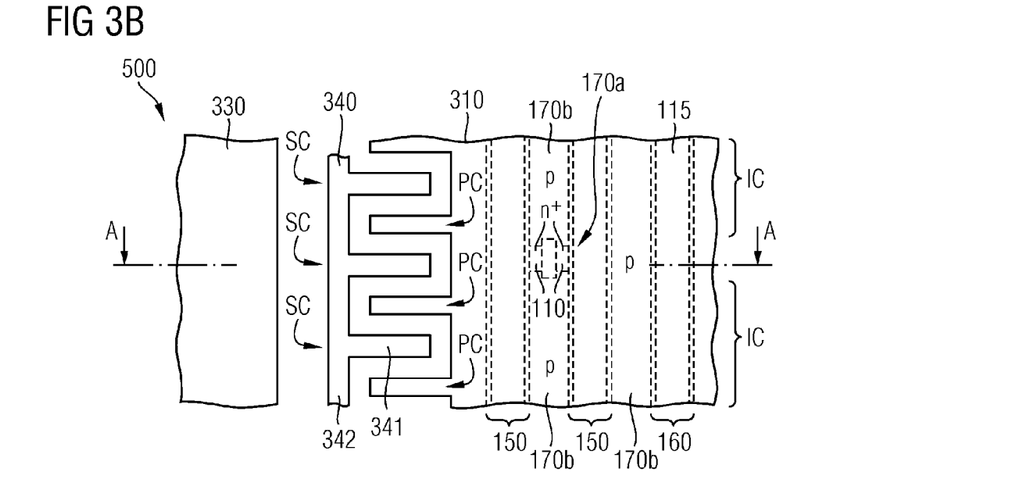
FIG. 3B is a schematic plan view of the semiconductor device portion of FIG. 3A.

FIGS. 3A to 3B refer to a semiconductor device 500 with stripe-shaped gate structures 150 in the transistor cell region, wherein stripe-shaped cell mesas 170 between the gate structures 150 may include active cell mesas 170a including source zones 110 and passive cell mesas 170b without source zones 110. Active and passive cell mesas 170a, 170b may alternate along the longitudinal extension of the cell mesas 170 or may alternate along a horizontal direction orthogonal to the longitudinal extension of the cell mesas 170 or both.

In addition, the transistor cell region 610 may include trench field electrode structures 160 extending between neighboring gate structures 150 from the first surface 101 into the semiconductor body 100. The field electrode structures 160 may include a conductive field electrode 165 and field dielectrics 161 insulating the field electrode 165 against the semiconductor body 100. Materials and configuration of the field electrode 165 may be the same as that of the gate electrode 155 and materials and configuration of the field dielectrics 161 may be the same as that of the gate dielectrics 151. The field electrode 165 may be electrically connected with the first load electrode 310 or with another structure in the semiconductor device 500.

Active cell mesas 170a directly adjoining gate structures 150 form the transistor cells TC. Passive cell mesas 170b without any source zones 110 or with source zones without low-ohmic connection to the first load electrode 310 form idle cells IC. In the idle cells IC, a vertical extension of the body zones 115 between the first surface 101 and the respective first pn junction pn1 may correspond to a distance between the first surface 101 and the first pn junction pn1 in an active cell mesa 170a.

According to other embodiments, the vertical extension of the body zones 115 in the idle cells IC may be greater than the distance between the first surface 101 and the first pn junctions pn1 in the active cell mesas 170a. For example, a vertical extension of the body zones 115 in the passive cell mesas 170b may be approximately equal to the vertical extension of the gate structures 150.

For RC-IGBTs, the body zones 115 of the idle cells IC may be electrically connected to the first load electrode 310. The body zones 115 of idle cells IC in non-reverse conducting IGBTs may be floating body zones.

A further portion of the drift structure 120 between the drift zone 121 and the collector structure 130 may form a field stop layer 128 or a buffer layer wherein a mean net dopant concentration in the field stop layer 128 is at least five times as high as a mean net dopant concentration in the drift zone 121.

For further details reference is made to the description of FIGS. 1A to 1D.

FIG. 3B shows a comb-like sense electrode 340 including dent portions 341 extending into notches in the adjoining edge of the first load electrode 310. The comb-like sense electrode 340 further includes a connecting portion 342 connecting the dent portions 341. The comb-like sense electrode 240 allows for connecting a plurality of sense cells SC in the metallization plane of the gate wiring structure 330 and the first load electrode 310.

Figure 4A:
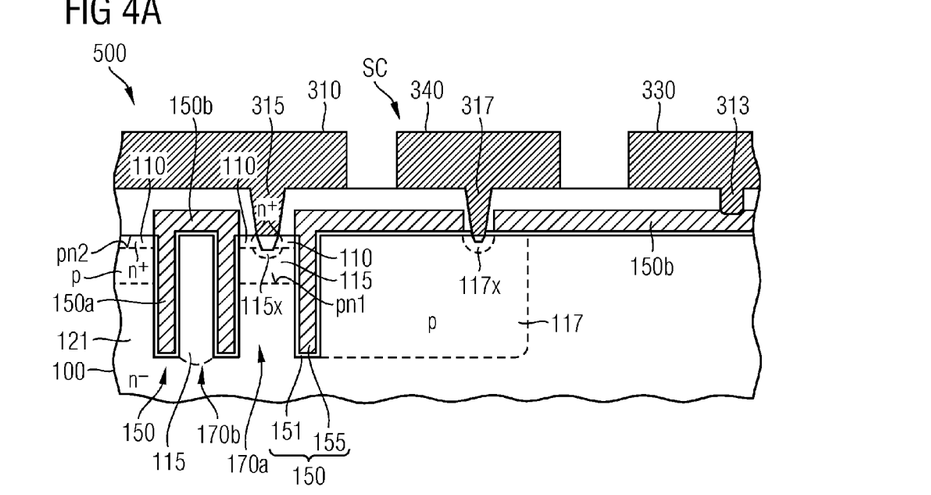
FIG. 4A is a schematic vertical cross-sectional view of a portion of a semiconductor device according to an embodiment concerning transistor cells with dot-shaped active cell mesas.
Figure 4B:
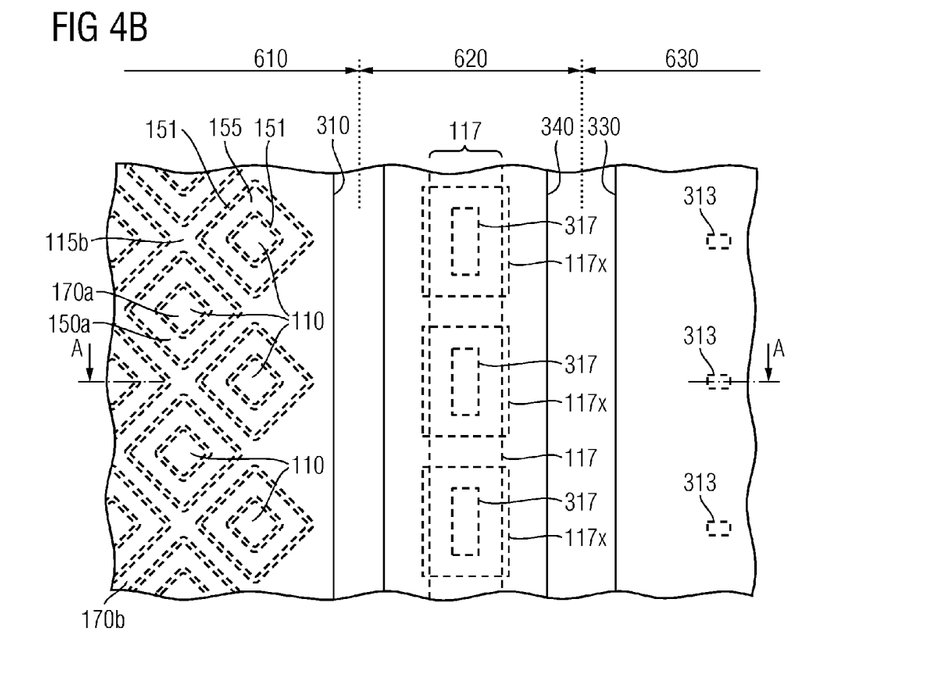
FIG. 4B is a schematic plan view of the semiconductor device portion of FIG. 4A.

FIGS. 4A to 4B refer to a semiconductor device 500 with gate structures 150 including ring-shaped trench portions 150a extending from the first surface 101 into the semiconductor body 100 as well as a connecting portion 150b extending outside the semiconductor body 100 along the first surface 101.

Dot-shaped active cell mesas 170a including body zones 115 and source zones 110 are formed within the ring-shaped trench portions 150a. A grid-shaped passive cell mesa 170b without source zones 110 is formed outside the ring-shaped trench portions 150a. A body zone 115 in the passive cell mesa 170b may float and may have a vertical extension that exceeds a distance between the first surface 101 and the first pn junctions pn1 in the active cell mesas 170a. For example, the vertical extension of the body zone 115 in the passive cell mesas 170b may be equal to or greater than a vertical extension of the ring-shaped trench portions 150a.

A vertical extension of the purge zone 117 in the transition region 620 may correspond to the vertical extension of the body zone 115 in the passive cell mesas 170b or to the vertical extension of the body zones 115 in the active cell mesas 170a.

The connecting portion 150b of the gate structure 150 may extend through the transition region 620 into the idle region 630. A gate contact 313 may extend through an interlayer dielectric 210, which separates the electrode structures 310, 330, 340 from the connecting portion 150b of the gate structure 150, to or into the connecting portion 150b.

Figure 5:
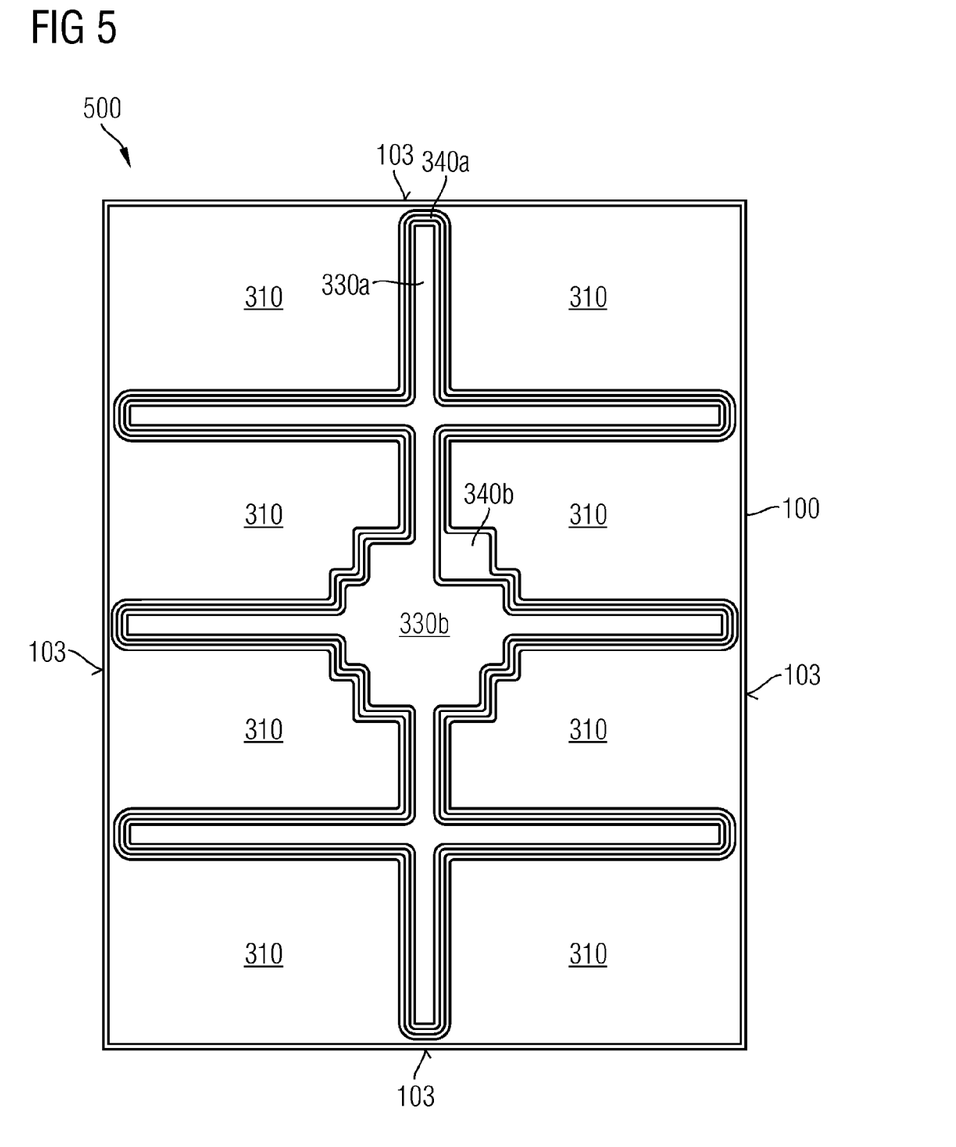
FIG. 5 is a schematic layout of a semiconductor device with sense cells according to a further embodiment.

FIG. 5 shows a semiconductor device 500 with a gate wiring structure 330 including a gate pad 330b in a center of the semiconductor body 100 and gate fingers 330a separating a first load electrode 310 into several separated sections. A sense electrode 340 may include a strip connection 340a, e.g., an aluminum connection line, along the edges of the gate wiring structure 330. The sense electrode 340 may further include a sense pad 340b connected with the strip connection 340a and adjoining the gate pad 330b. The sense pad 340b as well as the gate pad 330b may be landing pads for bondwires. According to other embodiments at least one of the gate and sense pads 330b, 340b is arranged close to a lateral side surface 103 of the semiconductor body 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a transistor cell region comprising transistor cells electrically connected to a first load electrode;
    an idle region comprising a gate wiring structure electrically connected to gate electrodes of the transistor cells; and
    a transition region disposed between the transistor cell region and the idle region and comprising at least one sensor cell electrically connected to a sense electrode and configured to convey a unipolar current during an on state of the transistor cells.

2. The semiconductor device of claim 1, wherein the transition region comprises purge cells electrically connected to the first load electrode and configured to convey the unipolar current during the on state of the transistor cells.

3. The semiconductor device of claim 2, wherein the purge cells are configured to drain off charge carriers from a drift structure when the transistor cells are in the on-state.

4. The semiconductor device of claim 2, wherein
the purge cells and the at least one sensor cell are arranged along a line parallel to an edge of the first load electrode.

5. The semiconductor device of claim 4, wherein
the sense electrode includes dent portions extending into notches of an edge of the first load electrode and a connecting portion connecting the dent portions.

6. The semiconductor device of claim 1, wherein
each transistor cell comprises, in a semiconductor body, a body zone forming a first pn junction with a drift structure and a second pn junction with a source zone.

7. The semiconductor device of claim 6, wherein
the at least one sensor cell comprises, in the semiconductor body, a purge zone forming a further first pn junction with the drift structure.

8. The semiconductor device of claim 6, wherein
the body zones are formed in active cell mesas adjoining gate structures extending from a first surface of the semiconductor body into the semiconductor body.

9. The semiconductor device of claim 6, wherein
the semiconductor body further comprises floating body zones forming further first pn junctions with the drift structure.

10. The semiconductor device of claim 6, further comprising:
a collector layer formed along a second surface of the semiconductor body opposite to the first surface, the collector layer forming a third pn junction with the drift structure.

11. The semiconductor device of claim 1, further comprising:
a bondwire electrically connecting the sense electrode and the first load electrode.

12. The semiconductor device of claim 1, wherein
the sense electrode and the first load electrode are electrically separated.

13. The semiconductor device of claim 1, further comprising:
a sense terminal electrically coupled to the sense electrode.

14. The semiconductor device of claim 1, further comprising:
a sense circuit electrically coupled to the sense electrode and configured to output a control signal indicating that a sense current of the semiconductor device exceeds a predetermined threshold.

15. The semiconductor device of claim 1, wherein
the gate wiring structure includes a gate pad.

16. The semiconductor device of claim 1, wherein
the gate wiring structure includes gate fingers running between sections of the first load electrode.

17. An insulated gate bipolar transistor, comprising:
a transistor cell region comprising transistor cells electrically connected to a first load electrode;
an idle region comprising a gate wiring structure electrically connected to gate electrodes of the transistor cells; and
a transition region disposed between the transistor cell region and the idle region and comprising at least one sensor cell electrically connected to a sense electrode and configured to convey a unipolar current during an on state of the transistor cells.

18. The insulated gate bipolar transistor of claim 17, wherein
the transition region comprises purge cells electrically connected to the first load electrode and configured to convey the unipolar current during the on state of the transistor cells.

19. The insulated gate bipolar transistor of claim 18, wherein
the purge cells are configured to drain off charge carriers from a drift structure when the transistor cells are in the on-state.

20. The insulated gate bipolar transistor of claim 18, wherein
the purge cells and the at least one sensor cell are arranged along a line parallel to an edge of the first load electrode.

* * * * *